US006759846B2

(12) United States Patent
Van Helvoort et al.

(10) Patent No.: US 6,759,846 B2
(45) Date of Patent: Jul. 6, 2004

(54) MR COIL MODULE

(75) Inventors: Marinus Johannes Adrianus Maria Van Helvoort, Eindhoven (NL); Johan Samuel Van Den Brink, Eindhoven (NL); Diana Maria Francisca Geraats, Eindhoven (NL); Paulus Cornelius Hendrikus Adrianus Haans, Eindhoven (NL); Cornelis Leonardus Gerardus Ham, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/243,055

(22) Filed: Sep. 13, 2002

(65) Prior Publication Data

US 2003/0057944 A1 Mar. 27, 2003

(30) Foreign Application Priority Data

Sep. 14, 2001 (EP) .............................................. 01203487

(51) Int. Cl.$^7$ ................................................ G01V 3/00
(52) U.S. Cl. ........................................ 324/300; 324/318
(58) Field of Search ................................ 324/300, 318, 324/319, 309, 307, 322, 314, 313; 600/424; 128/153.5

(56) References Cited

U.S. PATENT DOCUMENTS

| 5,666,055 A | | 9/1997 | Jones et al. ................. 324/318 |
| 5,757,189 A | * | 5/1998 | Molyneaux et al. ......... 324/318 |
| 6,249,121 B1 | * | 6/2001 | Boskamp et al. ........... 324/318 |
| 6,624,633 B1 | * | 9/2003 | Zou et al. .................... 324/318 |

OTHER PUBLICATIONS

Klaas P. Pruessmann, et al.; "SENSE: Sensitivity Encoding for Fast MRI", Magnetic Resonance in Medicine 42, pp. 952–962, 1999.

* cited by examiner

Primary Examiner—Brij B. Shrivastav
(74) Attorney, Agent, or Firm—Thomas M. Lundin

(57) ABSTRACT

The invention relates to an MR coil module for use in an MR imaging system for receiving and/or transmitting RF signals. In order to provide an MR coil module which allows a modular and user definable configuration of an RF coil system and which provides a high SENSE factor (>2), the MR coil module according to the invention comprises:

Figure 1:
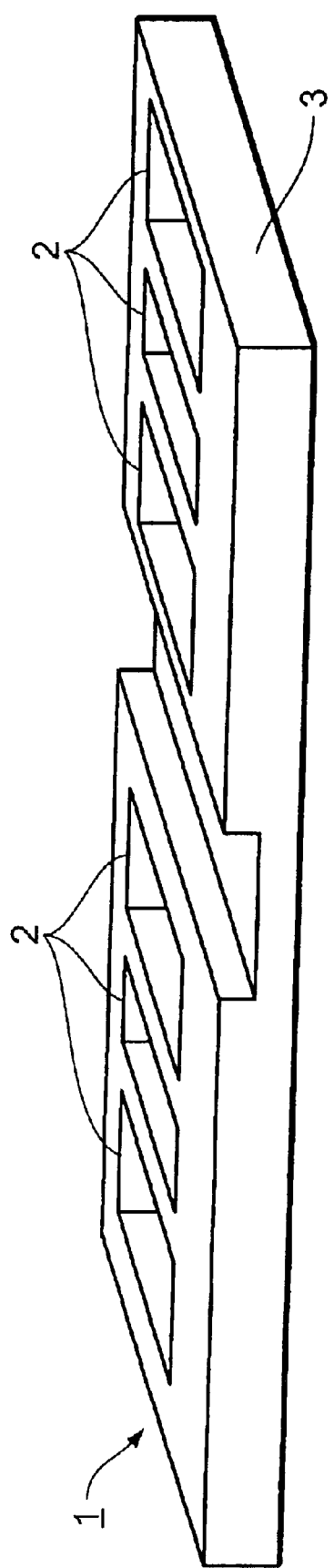

- at least two coil elements (21–26) positioned next to each other,
- a preamplifier (51–56) for each coil element (21–26),
- a signal bus (40) for transferring RF signals between said coil elements (21–26), an output means (10) and an input means (9),
- an output means (10) for outputting RF signals from the MR coil module (1),
- an input means (9) for inputting RF signals into the MR coil module (1),
- switching means (6) for switching the connections between said coil elements (21–26), said input means (9) and said output means (10), wherein said output means (10) and said input means (9) are adapted complementary so as to enable electrical and mechanical connection of the module (1) to other modules.

8 Claims, 4 Drawing Sheets

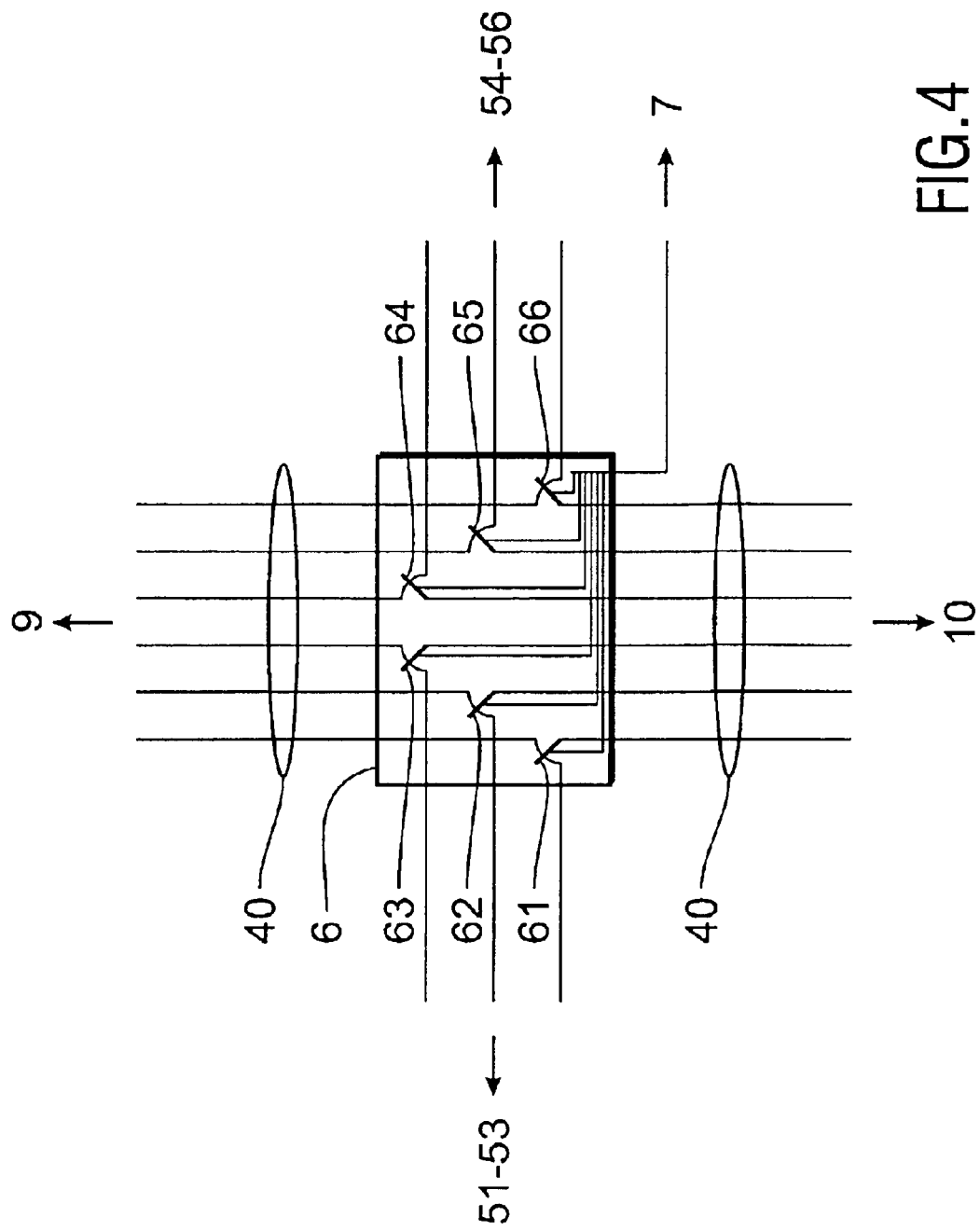

MR COIL MODULE

BACKGROUND

The invention relates to an MR (Magnetic Resonance) coil module for use in an MR imaging system for receiving and/or transmitting RF (Radio Frequency) signals. The invention relates further to an MR imaging system comprising an RF coil system for transmitting and/or receiving RF signals.

The article "SENSE: Sensitivity Encoding for Fast MRI", Klaas P. Pruessmann et al., Magnetic Resonance in Medicine 42:952–962 (1999) describes a concept for considerably enhancing the performance of magnetic resonance imaging (MRI) by means of arrays of multiple receiver coils. Therein sensitivity encoding (SENSE) is described which is based on the fact that receiver sensitivity generally has an encoding effect complementary to Fourier preparation by linear field gradients. By using multiple receiver coils in parallel scan time can be reduced and resolution can be increased.

In practice different kinds of receiver and/or transmitter RF coils are required for MRI in a very short time frame depending on the particular application, e. g. depending on the size and the location of the region of interest. It is thus an object of the present invention to provide an MR coil module which is usable for different applications in an MR imaging system and has better SENSE capabilities, in particular a higher SENSE factor, i. e. allowing an increased scan time reduction when using the described SENSE method.

SUMMARY

This object is achieved by an MR coil module for use in an MR imaging system for receiving and/or transmitting RF signals, the coil module including at least two coil elements positioned next to each other, a preamplifier for each coil element, a signal bus for transferring RF signals between said coil elements, an output means and an input means, an output means for outputting RF signals from the MR coil module, an input means for inputting RF signals into the MR coil module, switching means for switching the connections between said coil elements, said input means and said output means, wherein said output means and said input means are adapted complementary so as to enable electrical and mechanical connection of the module to other modules.

The invention is based on the idea to provide identical MR coil modules which can be used stand-alone or in combination with other, identical modules to increase the region of interest which can be covered. By using identical coil modules higher volumes in production can be achieved thus reducing the costs for development and production. In addition, development time is shorter since otherwise several different coils need to be developed in parallel. The user can start with a small set of coil modules and expand later to full coverage. Also if one module is not working, the other modules are still available for use. Since coils with a large coverage are necessarily big and difficult to handle, the coil modules according to the invention can be put on a patient support one by one thus making the handling easier.

According to the invention output means and input means are provided for outputting and inputting, respectively, RF signals and, at the same time, for electrically and mechanically connecting the module to other modules if required. Each module consists of a number of coil elements, the maximum number of coil elements being limited to the number of channels the MR imaging system can read out simultaneously. A signal bus is introduced, preferably as wide as the MR imaging system has simultaneous channels. Further, switching means are provided for connecting and disconnecting the signal bus of a module to the signal bus of other modules. When the module is connected to the MR imaging system but not used for scanning it should be disconnected from the signal bus so as not to interfere with other modules.

The preamplifiers are included in the coil module and located between the coil elements and the switching means, preferably close to each related coil element. Thus a good Signal-to-Noise ratio can be achieved.

According to one embodiment of the invention an MR coil module comprises at least two coil elements positioned next to each other without overlap, preferably when using SENSE coils. It has been found that an optimal SENSE coil providing an increased SENSE factor which is the factor by which the time duration of the scan is reduced by using the SENSE method, has no overlapping coil elements. In addition, it has been found that the exact location of the coil elements to each other is not very critical. The SENSE factor is, in general, determined by the number of coil elements which can receive signals in parallel independently. The more coil elements are available, the higher the SENSE factor.

To improve mechanical connection of the module to other modules mechanical connection means are provided. Such mechanical connection means may include snaps and/or flaps, which are preferably used in a flexible coil solution. By use of an additional flap on each module the module can be attached to the next module using Velcro. Alternatively, coil elements and coil modules could also be positioned simply next to each other without mechanical connection since, according to the invention, the exact location of the coil elements to each other is not very critical.

In another aspect of the invention output interface means and/or input interface means are provided for translating signals of the MR imaging system to signals of the MR coil module. Said interface means are preferably integrated into each MR coil module. However, said interface means could also be part of the MR imaging system. According to a preferred embodiment the switching means are adapted for connecting either said input means or said coil elements with said output means in order to prevent an interference of different signals on the signal bus. By said switching means a time multiplexing of different signals can be achieved.

The switching means may further include a switching element for each coil element which is adapted for connecting either said coil element or a corresponding input line of said input means with a corresponding output line of said output means. Thus, it can be selected, if signals from each single coil element of a coil module shall be transferred to the signal bus and to the output means or not.

In a further embodiment a module identifier is provided in each MR coil module. Said module identifier enables the MR coil system to identify which and how many MR coil modules are connected to the MR imaging system.

By combining several coil modules according to the invention several coil configurations can be made. For enabling the MR imaging system to know which configuration is used a resistor is provided in each coil module. When several coil modules are chained to each other these resistors are connected in parallel and the total resistance at the output of the first coil module decreases. The total resistance is thus a measure for the number of coil modules connected. It is also possible that the above mentioned interface means can translate the value of the resistance of several resistors connected in parallel when connecting several modules to a specific coil identifier allowing to identify the specific coil modules configuration.

The invention relates also to an MR imaging system comprising an RF coil system for transmitting and/receiving RF signals, said RF coil system including at least two identical connected MR coil modules as described herein.

DRAWINGS

Figure 2:
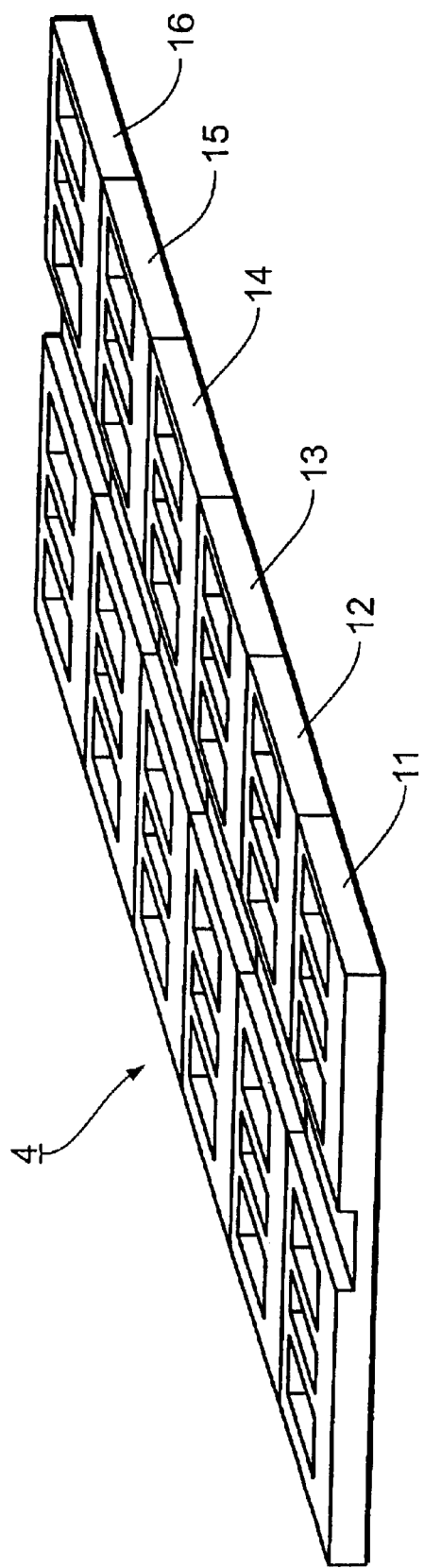
Figure 3:
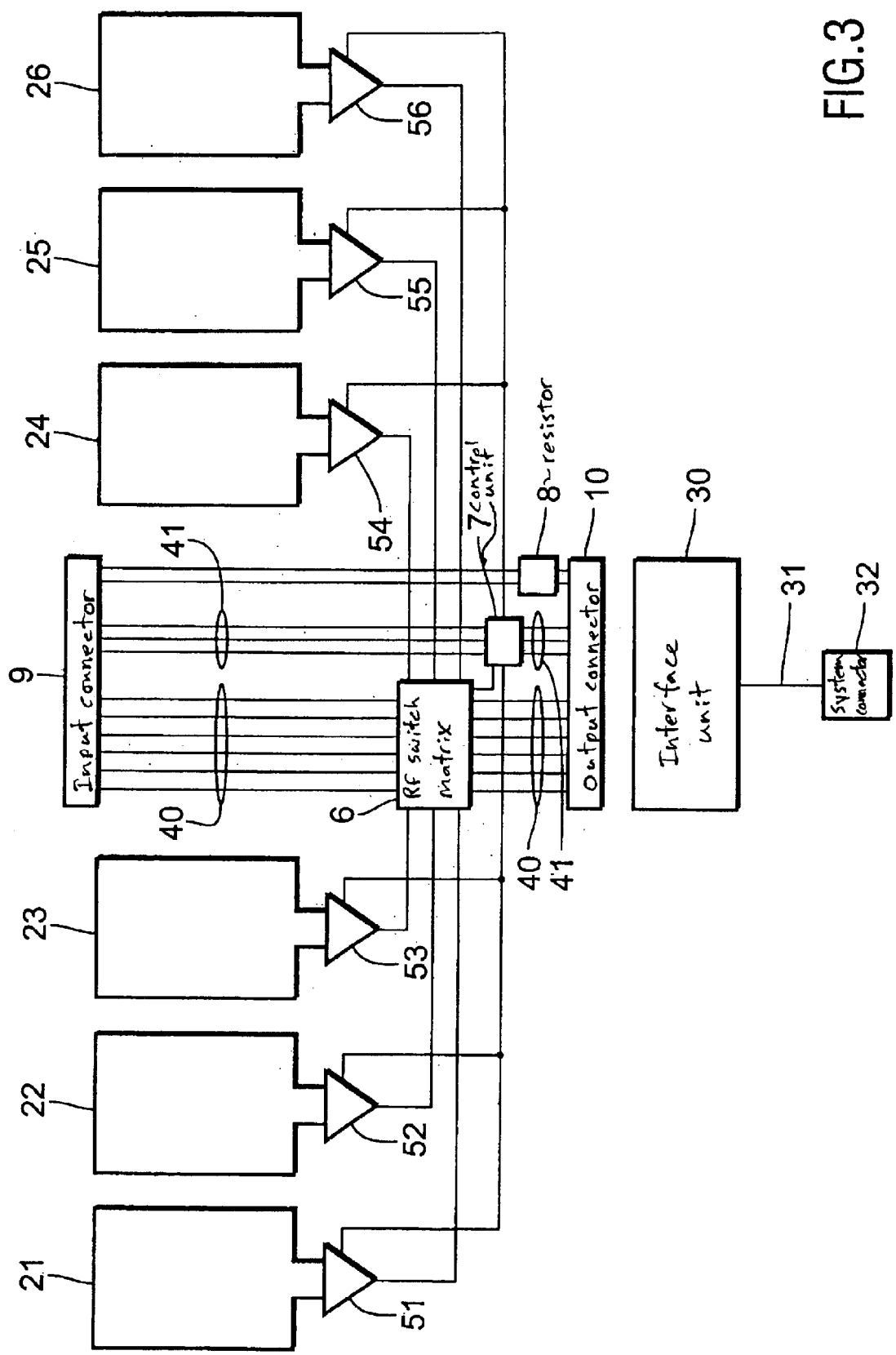

The invention will now be explained in more detail by way of an example as set out in the drawings in which FIG. 1 shows an MR coil module according to the invention FIG. 2 shows a combination of six MR coil modules according to the invention, FIG. 3 shows the electronic circuit scheme of an MR coil module according to the invention and FIG. 4 shows switching means used in an MR coil module according to the invention.

DESCRIPTION

FIG. 1 shows a single MR coil module 1 according to the invention comprising six coil elements 2 packaged in a coil carrier 3. A coil elements 2 includes conduction loops with dividing capacitors (not shown).

An RF coil system 4 for use in an MR imaging system is shown in FIG. 2. Said RF coil system comprises six identical MR coil modules 11 to 16 each comprising six coil elements as shown in FIG. 1. Said coil modules 11 to 16 are electrically and mechanically connected by appropriate electrical and mechanical connections (not shown). Said connections are provided complementary and adapted such that the MR coil modules 11 to 16 can be easily connected leaving certain degrees of freedom for the selection of the specific configuration to the user.

The proposed RF coil system as shown in FIG. 2 can be used as an RF receiver coil system for receiving RF signals from a region of interest and/or as RF transmitter coil system for transmitting RF signals into a region of interest for excitation. The proposed coil module 1 can be folded around a patient as a body wrap around. Half the number of the coil elements 2 then become posterior and half the number of the coil elements become anterior. Alternatively, the user can chose for left/right orientation instead of anterior/posterior. If simple single coil loops are used as coil elements only the left/right configuration can be used in an open MR imaging system. If butterfly loops are used as coil elements the anterior/posterior configuration also becomes available for open MR imaging systems.

A single coil module implemented as shown in FIG. 1 can be compared to a 6-channel and synergy body coil and could achieve a SENSE factor larger than 2. A major imaging speed can be obtained. It could also be used for cardiac imaging. When several coil modules 1 are combined as shown in FIG. 2 it becomes both possible to do peripheral vascular imaging and (lower) spine studies. The two outer modules, e. g. modules 11, 12, may provide good imaging of the arteries in the legs when using the coil system shown in FIG. 2 for scanning the legs. The center modules, e. g. modules 13 to 16, may provide good spine imaging, when using the coil system for scanning the spine. All modules 11 to 16 contribute to the increased imaging speed when using the SENSE method. For certain imaging procedures it might even be sufficient to use only one module in a flat position without wrapping it around the patient.

The handling of the MR coil module 1 as shown is easy. However, a combination of several coil modules for angiography could take up a large amount of coil modules leading to handling problems as with existing peripheral vascular coils. When connection means are available in the table top at magnet side and bottom side (or even more locations), it becomes feasible to combine coil modules into two or more RF coil systems, e. g. a body part having two coil modules and a leg part having three coil modules. An alternative is to create smaller coil modules, e. g. each having three coil elements, which allows the creation of an anterior and a posterior coil system. Thus, in between different patients, the posterior coil system can remain on the patient table.

The electronic circuit scheme of an MR coil module according to the invention is shown in FIG. 3. Said coil module comprises six coil elements 21 to 26 each being separately connected to a preamplifier 51 to 56 positioned near each related coil element 21 to 26 and provided with de-tune circuitry and optional cable traps. Said preamplifiers 51 to 56 are connected to an RF switch matrix 6 which either connects the RF signals from an input connector 9 to an output connector 10 or connects RF signals received from the coil elements 21 to 26 via the preamplifiers 51 to 56 to the output connector 10 when using said coil elements 21 to 26 as receiver coils. When using said coil elements 21 to 26 as transmitter coils RF signals inputted into the input connector 9 can be switched to the coil elements 21 to 26 via the RF switch matrix 6.

A control unit 7 is provided for tapping signals from the control bus 41, generating de-tune signals and controlling the RF switch 6. Further, a resistor 7 is provided for identification of the coil module, said resistor 8 being connected to the input connector 9 and the output connector 10 such that the resistors of several coil modules connected to each other are connected in parallel resulting in a total resistance identifying the number of coil modules connected.

The input connector 9 is provided for attaching another coil module to it, preferably by connecting the output connector of another module since the output connectors and the input connectors of the coil modules are adapted complementary. The output connector 10 is provided for outputting signals received from the coil elements 21 to 26 via the switch 6 and the signal bus 40 or inputted from another module at the input connector 9 and transferred via the signal bus 40 and the switch 6 to the output connector 10. Said output connector 10 is either connected to the input connector of another coil module or, as shown in FIG. 3, to an interface unit 30. Since the control signals of a coil module as shown in FIG. 3 will often not match the control signals generated in the MR imaging system, to which the coil module is connected, the interface unit "translates" the signals. The translated signals are then transferred via a standard system interconnection cable 31 to a standard system connector 32 for connecting the coil module to the MR imaging system. However, said interface unit could also be included in the MR imaging system.

The maximum number of coil elements per coil module is determined by the maximum number of receive channels in the MR imaging system. When several modules are connected to each other control signals and RF signals are connected via a control bus 41 and an RF signal bus 40. The RF signal bus is electrically decoupled from coil elements which are not in use. Further, the RF signal bus 40 is discontinuous in every coil module which is positioned further in the bore than the imaging volume, in order to prevent RF coupling which could disturb imaging quality and could also lead to safety problems. Low frequency filtering is used in the control bus 41.

A toroid trap is formed by winding a shielded cable into a toroid. At the terminals of the thus formed conductor a capacitor is connected, so that the complete structure comes in to resonance at the MR frequency and forms a high impedance along the cable so current flow is prevent. Typical implementations wind the cable not in a single toroid, but in a butterfly to reduce coupling of the inductor itself with the transmit field.

A bozooka is an alternative device, which uses a quarter Lambda (at MR frequency) transmission line section to form the high impedance. This device typically can be made smaller in cross-section than the toroid (but longer) and has no (or in practice) much less problems with coupling of the transmit field to the device itself, when compared to a toroid-type.

When a large coil is formed with the coil modules, the RF signal bus and the control bus will extend through the magnet bore and couple with the Quadrature Body Coil (QBC) being integrated in the scanner. The large currents which then start flowing could form a hazard for the patient and prevent optimal performance of the QBC. Said problem can be solved by using an RF switch 6 as shown in FIG. 4. Therein either both signal and ground are switched or a toroid trap or bazooka type trap is added in order to prevent currents to flow in the coils modules. In addition, the control bus 41 can be fed through the same trap or discrete filters can be added.

The switch 6 used in the coil module as shown in more detail in FIG. 4 comprises six switch elements 61 to 66 each being provided for switching either an RF signal received from the input connector 9 via the RF signal bus 40 or an RF signal received from the connected coil element 21 to 26 to the output connector 10 via the RF signal bus 40.

According to the invention MR coil modules are proposed which are easy to handle and allow a modular and user definable configuration of an RF coil system. Said RF coil system is usable for horizontal (cylindrical scanners) and vertical field (open scanners). Said MR coil modules are applicable for angiography, body imaging, (lower) spine imaging and cardiac imaging. A high SENSE factor larger than two is achievable.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. MR coil module for use in an MR imaging system for receiving and/or transmitting RF signals comprising:
at least two coil elements positioned next to each other,
a preamplifier for each coil element,
a signal bus for transferring RF signals between said coil elements, an output means and an input means,
an output means for outputting RF signals from the MR coil module, the RF signals including at least two signals each corresponding to individual coils of the at least two coil elements,
an input means for inputting RF signals into the MR coil module,
switching means for switching the connections between said coil elements, said input means and said output means,
wherein said output means and said input means are adapted complementary so as to enable electrical and mechanical connection of the module to other modules.

2. MR coil module according to claim 1, wherein said at least two coil elements are positioned next to each other without overlap.

3. MR coil module according to claim 1, further comprising mechanical connection means for mechanically connecting the module to other modules.

4. MR coil module according to claim 1, further comprising output interface means connected to said output means for converting RF signals to be outputted into system-readable RF signals readable by the MR imaging system and/or input interface means connected to said input means for converting RF signals inputted and to be transferred to said coil elements in into coil-readable RF signals readable by said coil elements.

5. MR coil module according to claim 1, wherein said switching means are adapted for connecting either said input means or said coil elements with said output means.

6. MR coil module according to claim 5, wherein said switching means comprises a switching element for each coil element which is adapted for connecting either said coil element or a corresponding input line of said input means with a corresponding output line of said output means.

7. MR coil module according to claim 1, further comprising a module identifier for identifying the module by the MR imaging system when the module is connected to other modules.

8. MR coil module according to claim 7, wherein said module identifier comprises a resistor provided for being connected to corresponding resistors of other modules when the module is connected to other modules.

* * * * *